(12) United States Patent
Chen

(10) Patent No.: US 6,333,561 B1
(45) Date of Patent: Dec. 25, 2001

(54) METHOD FOR MOUNTING A SEMICONDUCTOR CHIP ON A SUBSTRATE, AND SEMICONDUCTOR DEVICE ADAPTED FOR MOUNTING ON A SUBSTRATE

(76) Inventor: I-Ming Chen, No. 60, Lane 328, Li-Shan St., Nei-Hu Dist., Taipei City (TW)

( * ) Notice: Subject to any disclaimer, the term of this patent is extended or adjusted under 35 U.S.C. 154(b) by 0 days.

(21) Appl. No.: 09/564,989

(22) Filed: May 5, 2000

(30) Foreign Application Priority Data

Mar. 15, 2000 (TW) .............................. 89100578 A

(51) Int. Cl.⁷ .......................... H01L 23/48; H01L 23/52; H01L 23/40
(52) U.S. Cl. ............................................. 257/777; 257/678
(58) Field of Search .................................. 257/668, 673, 257/678, 707, 777, 778, 779, 737, 781, 738

(56) References Cited

U.S. PATENT DOCUMENTS 5,661,086 * 8/1997 Nakashima et al. ................. 257/668
5,990,546 * 11/1999 Igarashi et al. ...................... 257/700
6,075,712 * 6/2000 McMahon ............................ 361/783
6,114,754 * 9/2000 Kata ..................................... 257/668
6,143,991 * 11/2000 Moriyama ........................... 174/261

* cited by examiner

*Primary Examiner*—David Nelms
*Assistant Examiner*—David Nhu
(74) *Attorney, Agent, or Firm*—Foley & Lardner

(57) ABSTRACT

A semiconductor device is adapted for mounting on a substrate that has a chip-mounting region provided with a plurality of solder points. The semiconductor device includes a semiconductor chip having a pad-mounting surface provided with a plurality of bonding pads which are disposed on the pad-mounting surface at locations that are offset from locations of corresponding ones of the solder points on the chip-mounting region. Through a transfer printing unit, conductive bodies are transferred from a conductor-forming mold to the pad-mounting surface so that the required electrical connection among the bonding pads and the corresponding ones of the solder points can be established.

11 Claims, 5 Drawing Sheets

METHOD FOR MOUNTING A SEMICONDUCTOR CHIP ON A SUBSTRATE, AND SEMICONDUCTOR DEVICE ADAPTED FOR MOUNTING ON A SUBSTRATE

CROSS-REFERENCE TO RELATED APPLICATION

This application is a continuation-in-part (CIP) of co-pending U.S. patent application Ser. No. 09/520,719 filed by the applicant on Mar. 8, 2000, the entire disclosure of which is incorporated herein by reference.

BACKGROUND OF THE INVENTION

1. Field of the Invention

The invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distances between adjacent bonding pads are getting shorter. These can create difficulty when connecting the semiconductor chip to an external circuit, and can affect adversely the production yield.

In co-pending U.S. patent application Ser. No. 09/520,719 the applicant disclosed a semiconductor device that is adapted for mounting on a substrate having a chip-mounting region provided with a plurality of solder points. The semiconductor device includes a semiconductor chip having a pad-mounting surface provided with a plurality of bonding pads which are disposed on the pad-mounting surface at locations that are offset from locations of corresponding ones of the solder points on the chip-mounting region. Conductive bodies are formed on the pad-mounting surface to establish the required electrical connection among the bonding pads and the corresponding ones of the solder points.

SUMMARY OF THE INVENTION

The main object of the present invention is to provide a method of the type disclosed in the aforesaid co-pending U.S. patent application for mounting a semiconductor chip on a substrate so as to overcome the aforesaid drawback.

Another object of the present invention is to provide a semiconductor device of the type disclosed in the aforesaid co-pending U.S. patent application and adapted for mounting on a substrate so as to overcome the aforesaid drawback.

According to one aspect of the present invention, there is provided a method for mounting a semiconductor chip on a substrate. The substrate has a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method comprises the steps of:

providing a conductor-forming mold having one side formed with a plurality of conductor-receiving cavities, each of the conductor-receiving cavities having a first cavity part that is disposed in the conductor-forming mold at a location corresponding to that of a respective one of the bonding pads on the pad-mounting surface, and a second cavity part that extends from the first cavity part and that is disposed in the conductor-forming mold at a location corresponding to that of a respective one of the solder points on the chip-mounting region of the substrate;

filling the conductor-receiving cavities with a conductive metal paste to form conductive bodies respectively therein, each of the conductive bodies having an extension portion that is disposed in the first cavity part of the respective one of the conductor-receiving cavities, and an electrical connection portion that is disposed in the second cavity part of the respective one of the conductor-receiving cavities on one end of the extension portion; and through a transfer printing unit, transferring the conductive bodies from the conductor-forming mold to the pad-mounting surface of the semiconductor chip such that the extension portion of each of the conductive bodies is connected electrically to the respective one of the bonding pads, and such that the electrical connection portion of each of the conductive bodies extends to the location corresponding to that of the respective one of the solder points on the chip-mounting region of the substrate.

According to another aspect of the present invention, a semiconductor device is adapted for mounting on a substrate having a chip-mounting region provided with a plurality of solder points. The semiconductor device comprises:

a semiconductor chip having a pad-mounting surface provided with a plurality of bonding pads which are disposed on the pad-mounting surface at locations that are offset from locations of corresponding ones of the solder points on the chip-mounting region; and a plurality of conductive bodies, each of which has an extension portion that is connected electrically to a respective one of the bonding pads, and an electrical connection portion that is formed on one end of the extension portion and that extends to a location corresponding to that of a respective one of the solder points on the chip-mounting region of the substrate. The conductive bodies are formed by:

providing a conductor-forming mold having one side formed with a plurality of conductor-receiving cavities, each of the conductor-receiving cavities having a first cavity part that is disposed in the conductor-forming mold at a location corresponding to that of a respective one of the bonding pads on the pad-mounting surface, and a second cavity part that extends from the first cavity part and that is disposed in the conductor-forming mold at a location corresponding to that of a respective one of the solder points on the chip-mounting region of the substrate;

filling the conductor-receiving cavities with a conductive metal paste to form the conductive bodies respectively therein, the extension portions of the conductive bodies being disposed in the first cavity parts of the conductor-receiving cavities, the electrical connection portions of the conductive bodies being disposed in the second cavity parts of the conductor-receiving cavities; and through a transfer printing unit, transferring the conductive bodies from the conductor-forming mold to the pad-mounting surface of the semiconductor chip.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
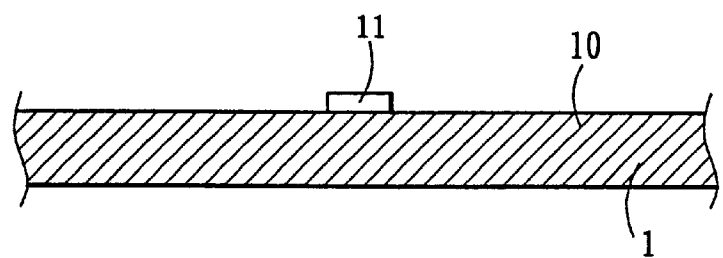
FIG. 1 is a sectional view illustrating a semiconductor chip to be mounted on a substrate according to the first preferred embodiment of a mounting method of the present invention.

Before the present invention is described in greater detail, it should be noted that like elements are denoted by the same reference numerals throughout the disclosure.

Referring to FIG. 1, in the first preferred embodiment of a mounting method according to the present invention, there is provided a semiconductor chip 1 having a pad-mounting surface 10 with a plurality of bonding pads 11 (only one is shown in this FIG.) provided thereon. The semiconductor chip 1 is to be mounted on a substrate 9 (see FIG. 6). The substrate 9, such as a system board, has a chip-mounting region provided with a plurality of solder points 90. The bonding pads 11 are to be connected to corresponding ones of the solder points 90, but are disposed on the pad-mounting surface 10 at locations that are offset from locations of the corresponding ones of the solder points 90 on the chip-mounting region.

Figure 2:
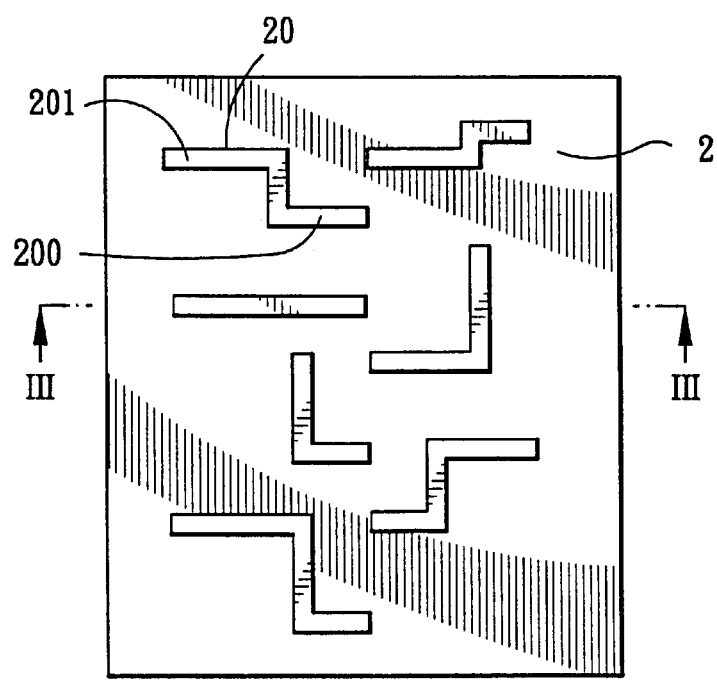
FIG. 2 is a schematic view illustrating a conductor-forming mold used in the mounting method of the first preferred embodiment.
Figure 3:
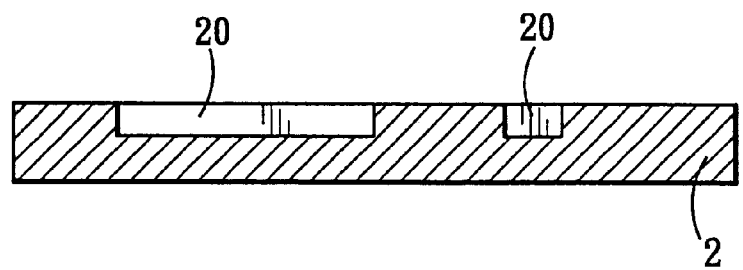
FIG. 3 is a sectional view of the conductor-forming mold, taken along lines III—III in FIG. 2.

Referring to FIGS. 2 and 3, there is provided a conductor-forming mold 2 having one side formed with a plurality of non-intersecting conductor-receiving cavities 20. Each of the conductor-receiving cavities 20 has a first cavity part 200 that is disposed in the conductor-forming mold 2 at a location corresponding to that of a respective one of the bonding pads 11 on the pad-mounting surface 10, and a second cavity part 201 that extends from the first cavity part 200 and that is disposed in the conductor-forming mold 2 at a location corresponding to that of a respective one of the solder points 90 on the chip-mounting region of the substrate 9 (see FIG. 6).

Figure 4:
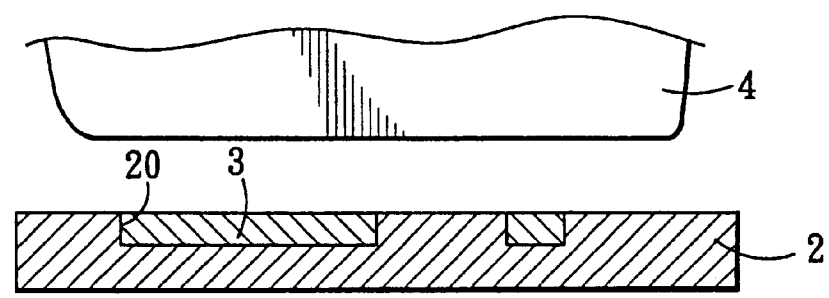
FIG. 4 is a sectional view illustrating how conductive bodies are formed in conductor-receiving cavities of the conductor-forming mold according to the mounting method of the first preferred embodiment.

Thereafter, as shown in FIG. 4, non-intersecting conductive bodies 3 are formed respectively in the conductor-receiving cavities 20 by filling the latter with a conductive metal paste, such as one that contains silver, gold, copper, iron, aluminum, tin, lead or other conductive metal materials.

Figure 5:
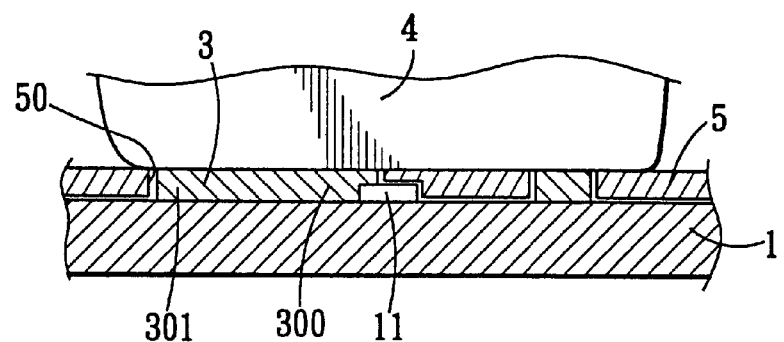
FIG. 5 is a sectional view illustrating how the conductive bodies are transferred to the semiconductor chip of FIG. 1 according to the mounting method of the first preferred embodiment.

Referring to FIG. 5, a conductor-positioning plate 5 is superimposed on the pad-mounting surface 10 of the semiconductor chip 1. The conductor-positioning plate 5 is formed with a plurality of conductor-positioning holes 50 that correspond in size, shape and position with the conductor-receiving cavities 20 in the conductor-forming mold 2, respectively. Subsequently, with the use of a transfer printing unit 4, the conductive bodies 3 are transferred from the conductor-forming mold 2 via known transfer printing techniques (see FIG. 4), and are fitted into the conductor-positioning holes 50 in the conductor-positioning plate 5 for mounting on the pad-mounting surface 10 of the semiconductor chip 1. The conductor-positioning plate 5 prevents lateral deformation of the conductive bodies 3 when the latter are pressed by the transfer printing unit 4 toward the pad-mounting surface 10 of the semiconductor chip 1. Upon removal of the conductor-positioning plate 5 from the pad-mounting surface 10, the conductive bodies 3 are processed by heating and drying to harden the same. A semiconductor device is thus obtained. Each of the conductive bodies 3 of the semiconductor device has an elongate extension portion 300 that is formed in the first cavity part 200 of the respective conductor-receiving cavity 20, and an electrical connection portion 301 that is formed in the second cavity part 201 of the respective conductor-receiving cavity 200 on one end of the extension portion 300. The extension portion 300 is connected electrically to a respective one of the bonding pads 11. The electrical connection portion 301 extends to the location corresponding to that of a respective one of the solder points 90 on the chip-mounting region of the substrate 9 (see FIG. 6) for electrical connection therewith.

Figure 6:
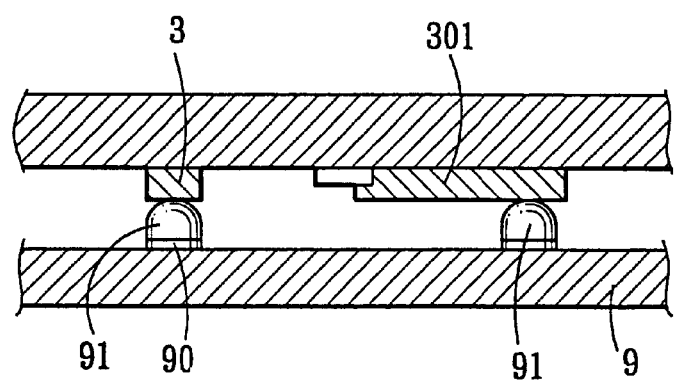
FIG. 6 is a sectional view illustrating how a semiconductor device prepared according to the mounting method of the first preferred embodiment is mounted on a substrate.

As shown in FIG. 6, the semiconductor device thus obtained is mounted on the chip-mounting region of the substrate 9. The electrical connection portions 301 of the conductive bodies 3 are connected to the corresponding ones of the solder points 90 via conductive paste 91 pre-disposed on the latter, thereby establishing electrical connection between the semiconductor chip 1 and the substrate 9. Alternatively, connection between the electrical connection portions 301 of the conductive bodies 3 and the solder points 90 can be established via solder paste on the latter. Preferably, an adhesive layer (not shown) adheres the semiconductor device to the chip-mounting region of the substrate 9 to prevent relative movement therebetween prior to heating of the assembly of the semiconductor device and the substrate 9 so as to harden the conductive paste 91.

Figure 7:
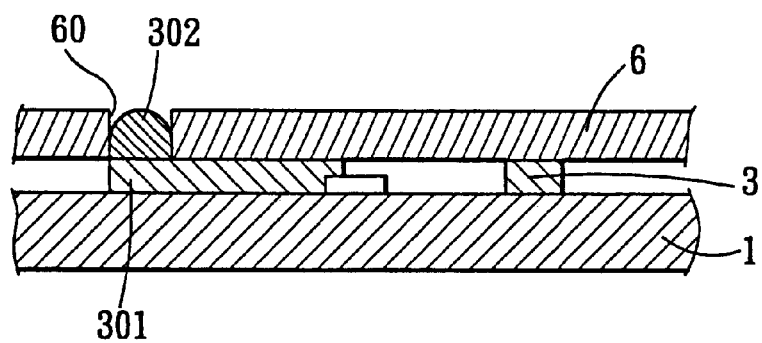
FIG. 7 is a sectional view illustrating how a semiconductor device is prepared according to the second preferred embodiment of a mounting method of the present invention.

Referring to FIG. 7, in the second preferred embodiment of a mounting method according to the present invention, after the conductive bodies 3 are mounted on the pad-mounting surface 10 of the semiconductor chip 1 in accordance with the mounting method of the first preferred embodiment, a protrusion-forming plate 6 that is formed with a plurality of protrusion-forming holes 60 (only one is shown in this FIG.) is superimposed on the pad-mounting surface 10 of the semiconductor chip 1. Each of the protrusion-forming holes 60 is registered with the electrical connection portion 301 of a respective one of the conductive bodies 3 on the semiconductor chip 1, and is confined by a wall that cooperates with the electrical connection portion 301 of the respective one of the conductive bodies 3 to form a protrusion-receiving space. Thereafter, conductive protrusions 302 are formed respectively in the protrusion-receiving spaces via a printing technique that uses a conductive metal paste as printing material. Because the conductive protrusions 302 and the conductive bodies 3 are made from the same material, the conductive protrusions 302 can fuse with the electrical connection portions 301 of the conductive bodies 3. Upon removal of the protrusion-forming plate 6 from the pad-mounting surface 10 of the semiconductor chip 1, the conductive bodies 3 and the conductive protrusions 302 are processed by heating and drying to harden the same.

Figure 8:
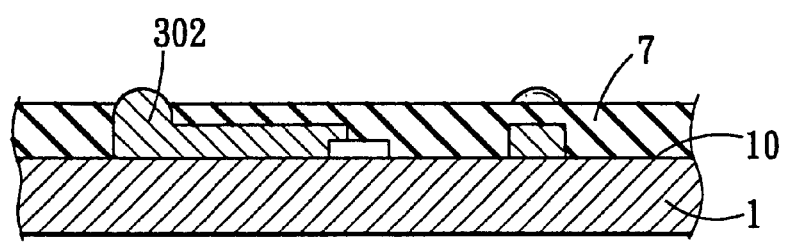
FIG. 8 is a sectional view of the semiconductor device prepared according to the mounting method of the second preferred embodiment.

Thereafter, as shown in FIG. 8, a protective layer 7 made of an insulator material, such as a resin, is formed on the pad-mounting surface 10 of the semiconductor chip 1. The conductive protrusions 302 protrude through the protective layer 7. A semiconductor device is thus obtained.

Figure 9:
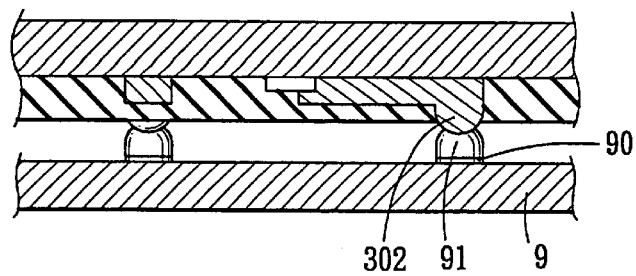
FIG. 9 is a sectional view illustrating how the semiconductor device of FIG. 8 is mounted on a substrate in accordance with the mounting method of the second preferred embodiment.

Referring to FIG. 9, the semiconductor device of FIG. 8 is mounted on the chip-mounting region of a substrate 9. The conductive protrusions 302 are connected to the corresponding ones of the solder points 90 via conductive paste 91 pre-disposed on the latter, thereby establishing electrical connection between the semiconductor chip 1 and the substrate 9. Like the first preferred embodiment, connection between the conductive protrusions 302 and the solder points 90 can be established via solder paste on the latter. Furthermore, an adhesive layer (not shown) can be used to adhere the semiconductor device of FIG. 8 to the chip-mounting region of the substrate 9 to prevent relative movement therebetween prior to heating of the assembly of the semiconductor device and the substrate 9 so as to harden the conductive paste 91.

Figure 10:
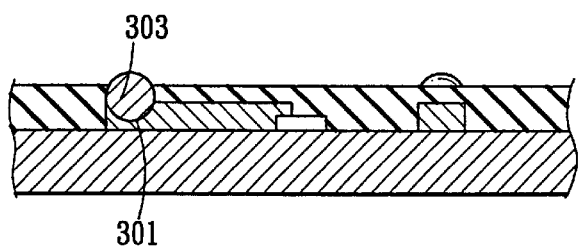
FIG. 10 is a sectional view illustrating a semiconductor device prepared according to the third preferred embodiment of a mounting method of the present invention.

FIG. 10 illustrates a semiconductor device prepared according to the third preferred embodiment of a mounting method according to the present invention. Unlike the second preferred embodiment, after the conductive bodies 3 are mounted on the pad-mounting surface 10 of the semiconductor chip 1, a conductive ball 303 is provided on the electrical connection portion 301 of each of the conductive bodies 3. In this embodiment, the conductive ball 303 is a copper ball electroplated with a conductive metal material, such as gold, silver, tin or aluminum.

When the semiconductor device of FIG. 10 is mounted on the chip-mounting region of a substrate, the conductive balls 303 are connected to the corresponding ones of the solder points on the chip-mounting region via conductive paste or solder paste pre-disposed on the latter, thereby establishing electrical connection between the semiconductor chip 1 and the substrate.

Figure 11:
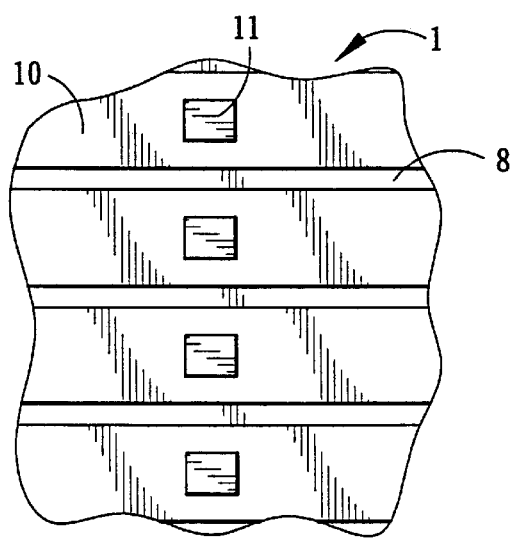
FIG. 11 is a fragmentary schematic view illustrating another semiconductor chip that can be used in the mounting method of the present invention.

Referring to FIG. 11, in order to prevent the occurrence of short-circuiting due to the relatively short distance between adjacent ones of the bonding pads 11, an insulator barrier 8, made of resin, may be formed on the pad-mounting surface 10 of the semiconductor chip 1 between every adjacent pair of the bonding pads 11.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region; and a plurality of conductive bodies, each of which has an extension portion that is connected electrically to a respective one of said bonding pads, and an electrical connection portion that is formed on one end of said extension portion and that extends to a location corresponding to that of a respective one of the solder points on the chip-mounting region of the substrate, said conductive bodies being formed by:

providing a conductor-forming mold having one side formed with a plurality of conductor-receiving cavities, each of said conductor-receiving cavities having a first cavity part that is disposed in said conductor-forming mold at a location corresponding to that of a respective one of said bonding pads on said pad-mounting surface, and a second cavity part that extends from said first cavity part and that is disposed in said conductor-forming mold at a location corresponding to that of a respective one of the solder points on the chip-mounting region of the substrate;

filling said conductor-receiving cavities with a conductive metal paste to form said conductive bodies respectively therein, said extension portions of said conductive bodies being disposed in said first cavity parts of said conductor-receiving cavities, said electrical connection portions of said conductive bodies being disposed in said second cavity parts of said conductor-receiving cavities; and through a transfer printing unit, transferring said conductive bodies from said conductor-forming mold to said pad-mounting surface of said semiconductor chip.

2. The semiconductor device of claim 1, further comprising a plurality of insulator barriers, each of which is formed on said pad-mounting surface between an adjacent pair of said bonding pads.

3. The semiconductor device of claim 2, wherein said insulator barriers are formed from a resin material.

4. The semiconductor device of claim 1, further comprising a plurality of conductive balls, each of which is disposed on said electrical connection portion of a respective one of said conductive bodies.

5. The semiconductor device of claim 4, wherein each of said conductive balls is a copper ball electroplated with a conductive metal material.

6. The semiconductor device of claim 4, further comprising a protective layer made of an insulator material and formed on said pad-mounting surface of said semiconductor chip, said conductive balls protruding through said protective layer.

7. The semiconductor device of claim 6, wherein said protective layer is formed from a resin material.

8. The semiconductor device of claim 1, wherein said conductive metal paste contains one of silver, gold, copper, iron, aluminum, tin and lead.

9. The semiconductor device of claim 1, wherein said electrical connection portion of each of said conductive bodies has a conductive protrusion formed thereon.

10. The semiconductor device of claim 9, further comprising a protective layer made of an insulator material and formed on said pad-mounting surface of said semiconductor chip, said conductive protrusions protruding through said protective layer.

11. The semiconductor device of claim 10, wherein said protective layer is formed from a resin material.

* * * * *